(12) United States Patent
Shon et al.

(10) Patent No.: US 11,559,966 B2
(45) Date of Patent: Jan. 24, 2023

(54) DECORATIVE MEMBER AND MANUFACTURING METHOD THEREFOR

(71) Applicant: LG CHEM, LTD., Seoul (KR)

(72) Inventors: Jeong Woo Shon, Daejeon (KR); Song Ho Jang, Daejeon (KR); Yong Chan Kim, Daejeon (KR); Jin Suk Song, Daejeon (KR); Pilsung Jo, Daejeon (KR); Ki Hwan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 119 days.

(21) Appl. No.: 16/616,861

(22) PCT Filed: Jun. 27, 2018

(86) PCT No.: PCT/KR2018/007284
§ 371 (c)(1),
(2) Date: Nov. 25, 2019

(87) PCT Pub. No.: WO2019/004725
PCT Pub. Date: Jan. 3, 2019

(65) Prior Publication Data
US 2021/0170718 A1    Jun. 10, 2021

(30) Foreign Application Priority Data

Jun. 27, 2017 (KR) .......... 10-2017-0081419
Oct. 20, 2017 (KR) .......... 10-2017-0136828

(51) Int. Cl.
*B32B 7/023* (2019.01)
*B32B 3/26* (2006.01)
(Continued)

(52) U.S. Cl.
CPC ........... *B32B 7/023* (2019.01); *B32B 3/263* (2013.01); *B32B 3/30* (2013.01); *B32B 15/08* (2013.01);
(Continued)

(58) Field of Classification Search
CPC .. B32B 7/023; B32B 3/26; B32B 3/30; B32B 3/263; B32B 15/08; B32B 2307/402; B32B 2307/416; B32B 2307/418; B32B 2451/00
See application file for complete search history.

(56) References Cited

U.S. PATENT DOCUMENTS 6,344,288 B1    2/2002   Oyama et al.
7,727,618 B2 *  6/2010   Iwano .................. H01H 13/86
                                                     428/204
(Continued)

FOREIGN PATENT DOCUMENTS

CN        2056903 U      5/1990
CN      101666886 A      3/2010
(Continued)

OTHER PUBLICATIONS

Database WPI: "Black film structure designing method, involves adhering connection layer with primary photo-absorption layer, calculating thickness of connection layer, and adhering secondary photo-absorption layer on substrate", XP002798448, Thomson Scientific, Oct. 1, 2013 (Corresponds to CN103364853A), 2 pp.
(Continued)

*Primary Examiner* — Joanna Pleszczynska
(74) *Attorney, Agent, or Firm* — Dentons US LLP

(57) ABSTRACT

The present disclosure relates to a decoration element comprising a light reflective layer, and a light absorbing layer provided on the light reflective layer and comprising Si.

10 Claims, 13 Drawing Sheets

(51) Int. Cl.
*B32B 3/30* (2006.01)
*B32B 15/08* (2006.01)

(52) U.S. Cl.
CPC ... *B32B 2307/402* (2013.01); *B32B 2307/416* (2013.01); *B32B 2307/418* (2013.01); *B32B 2451/00* (2013.01)

(56) References Cited

U.S. PATENT DOCUMENTS

| | | |
|---|---|---|
| 8,816,932 B2 | 8/2014 | Kawaguchi et al. |
| 10,066,069 B2 | 9/2018 | Hall et al. |
| 2008/0206495 A1* | 8/2008 | Korechika ............... G02B 5/09 428/30 |
| 2009/0301191 A1* | 12/2009 | Dick ....................... G01N 21/45 73/335.01 |
| 2010/0060987 A1 | 3/2010 | Witzman et al. |
| 2010/0207842 A1 | 8/2010 | Kawaguchi et al. |
| 2011/0262713 A1 | 10/2011 | Nakao et al. |
| 2012/0003489 A1 | 1/2012 | Ying |
| 2012/0236385 A1 | 9/2012 | Yun et al. |
| 2013/0048072 A1 | 2/2013 | Choi |
| 2015/0212244 A1 | 7/2015 | Kim et al. |

FOREIGN PATENT DOCUMENTS

| | | |
|---|---|---|
| CN | 102310706 A | 1/2012 |
| CN | 102971862 A | 3/2013 |
| CN | 103364853 A | 10/2013 |
| CN | 104602909 A | 5/2015 |
| JP | 05269952 A | 10/1993 |
| JP | 2009092913 A | 4/2009 |
| JP | 2010173273 A | 8/2010 |
| JP | 2010188713 A | 9/2010 |
| JP | 2010197798 A | 9/2010 |
| JP | 4898506 B2 | 3/2012 |
| JP | 5016722 B2 | 9/2012 |
| JP | 2017111248 A | 6/2017 |
| KR | 20020091535 A | 12/2002 |
| KR | 20050116645 A | 12/2005 |
| KR | 100563419 B1 | 3/2006 |
| KR | 20100013504 A | 2/2010 |
| KR | 20100077768 A | 8/2010 |
| KR | 101157863 B1 | 6/2012 |
| KR | 20170003529 A | 1/2017 |

OTHER PUBLICATIONS

Mokrzycki, W.S., et al., "Colour Difference ΔE—A Survey", Machine Graphics and Vision, Apr. 2011, 20(4):383-411, Olsztyn, Poland.

* cited by examiner

[FIG. 1]
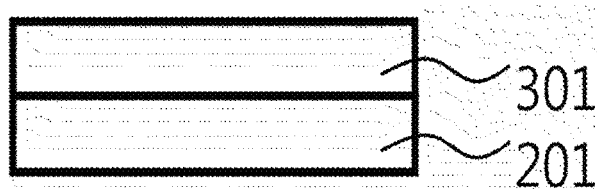
[FIG. 2]
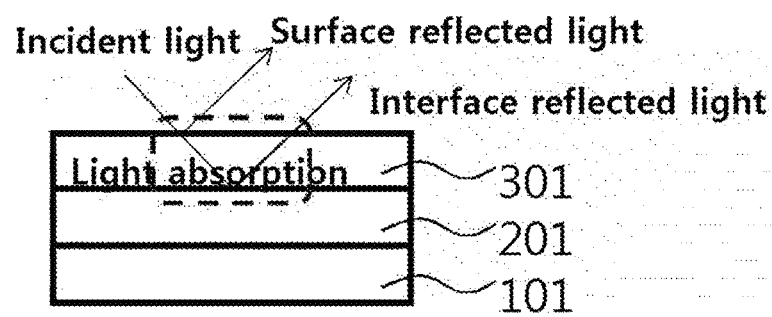
[FIG. 3]
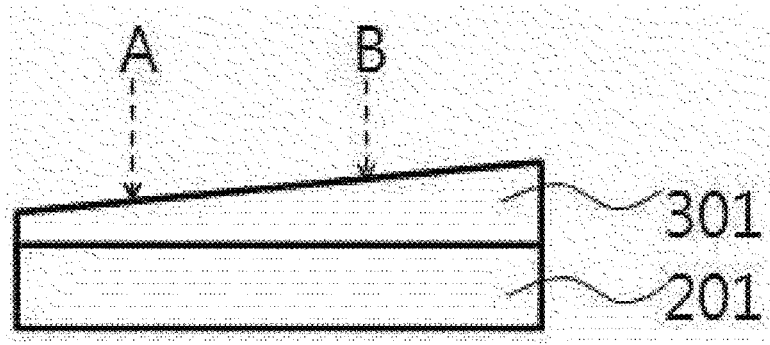

[FIG. 4]
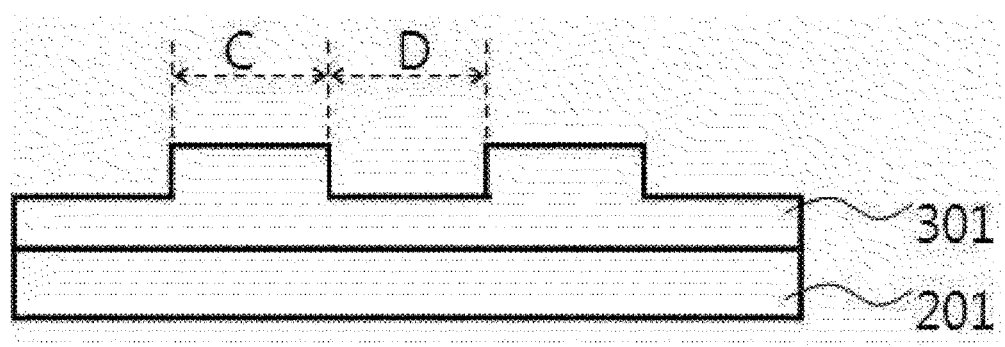
[FIG. 5]
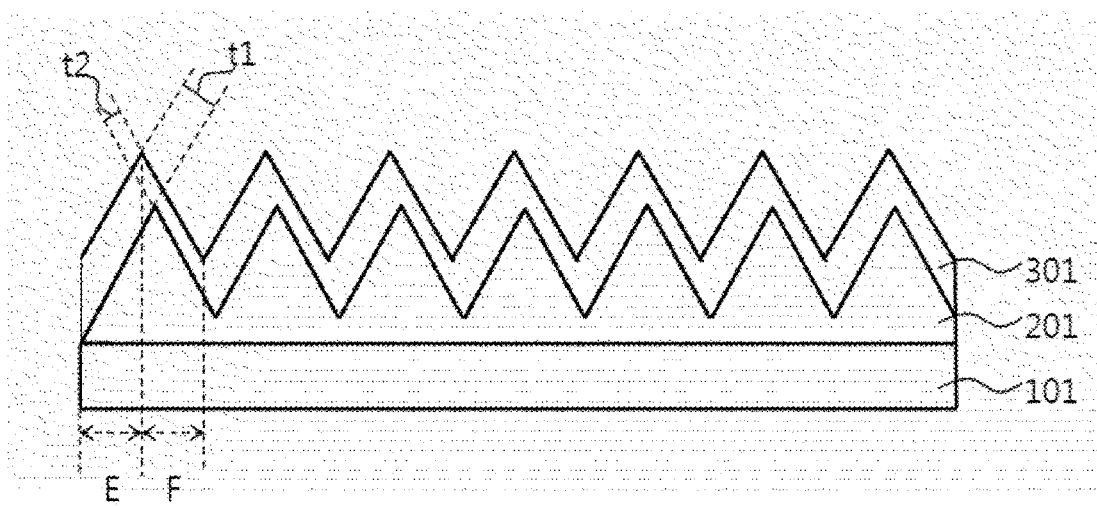

[FIG. 6]
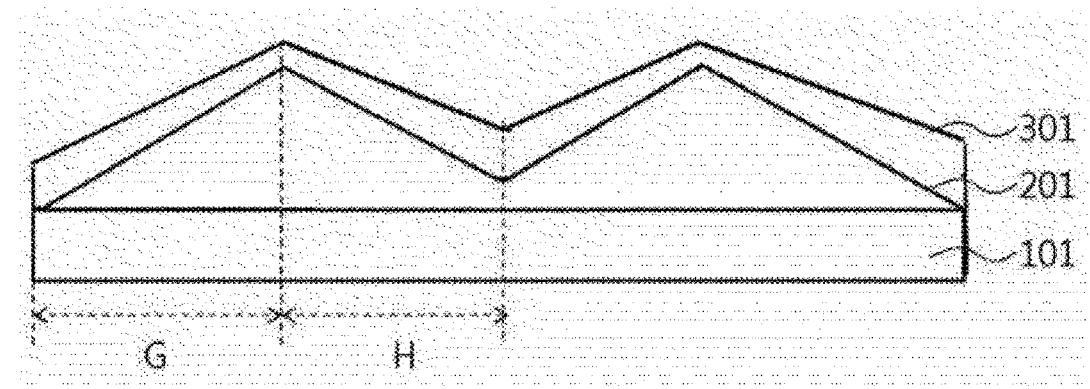
[FIG. 7]
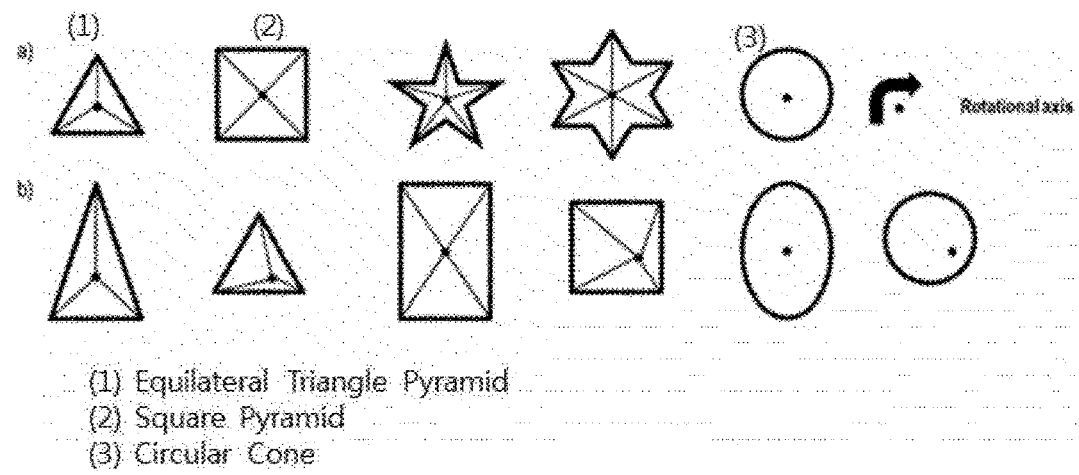
(1) Equilateral Triangle Pyramid
(2) Square Pyramid
(3) Circular Cone

[FIG. 8]
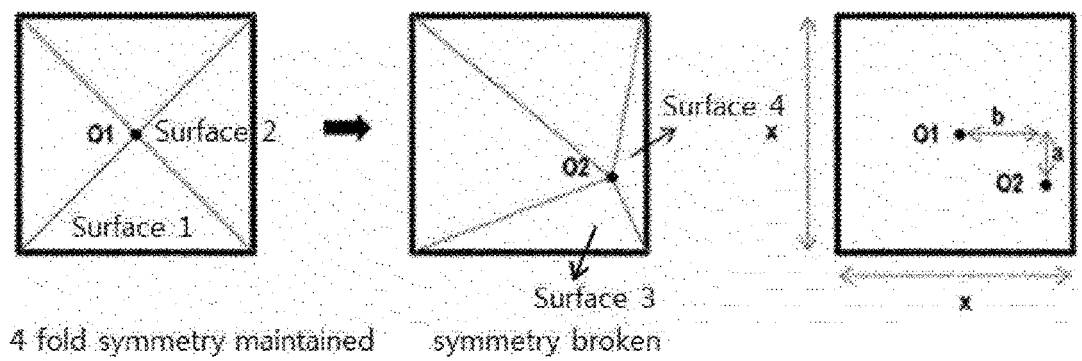
[FIG. 9(a)] [FIG. 9(b)]
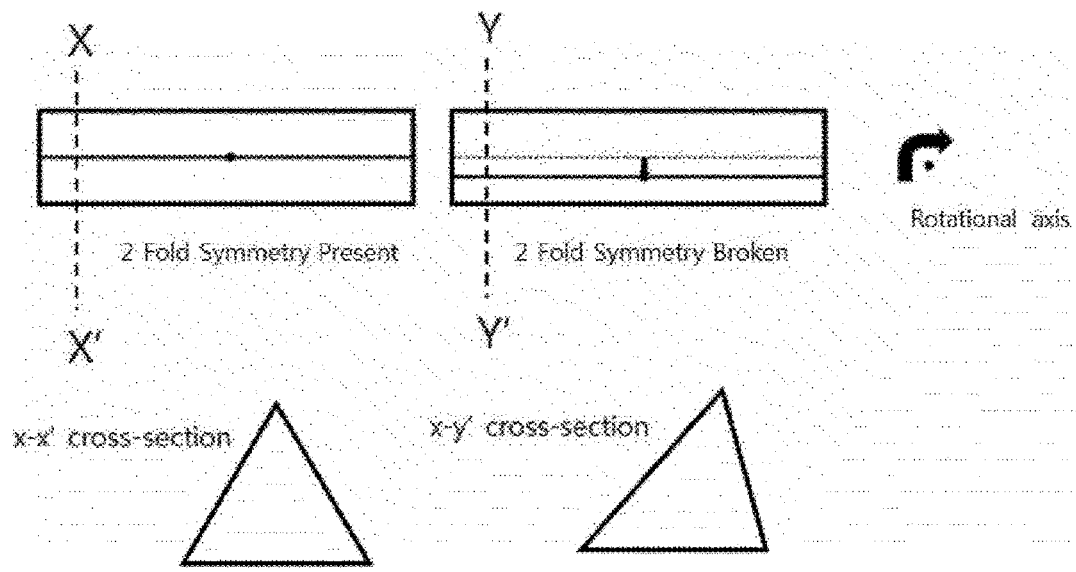

[FIG. 10]
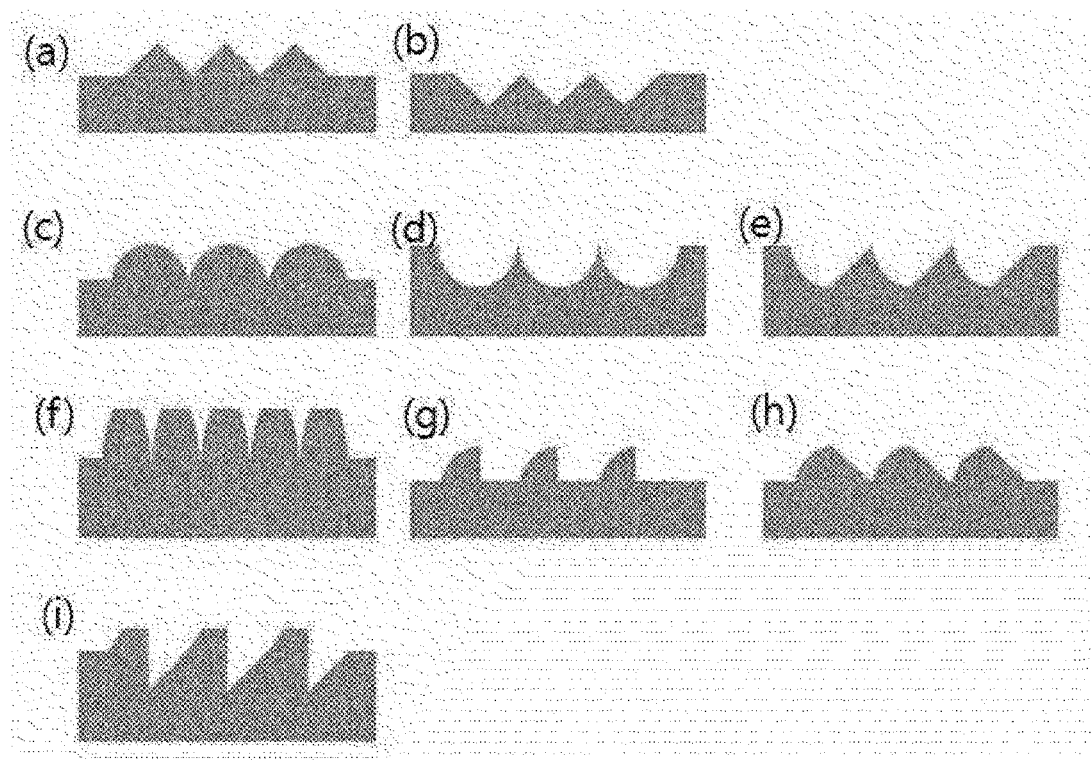

[FIG. 11(a)]
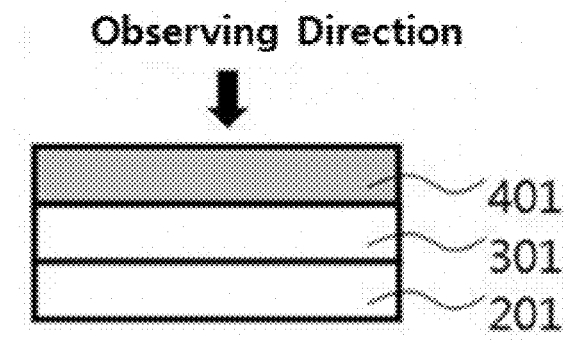
[FIG. 11(b)]
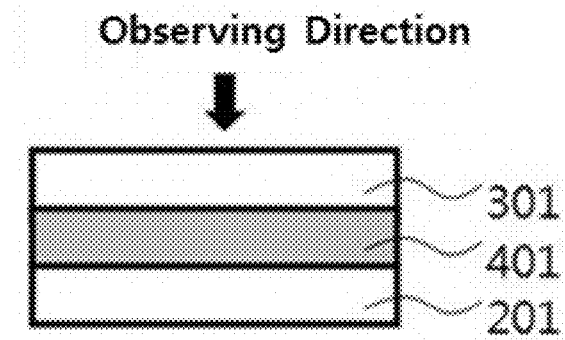
[FIG. 11(c)]
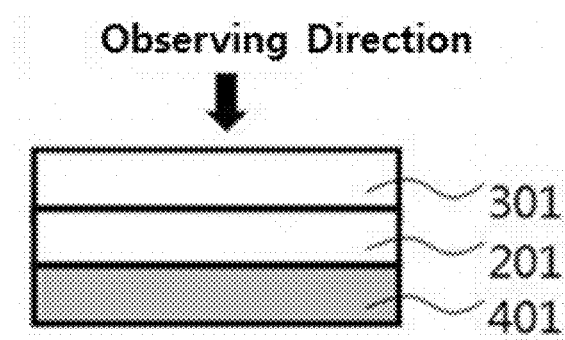

[FIG. 12(a)]
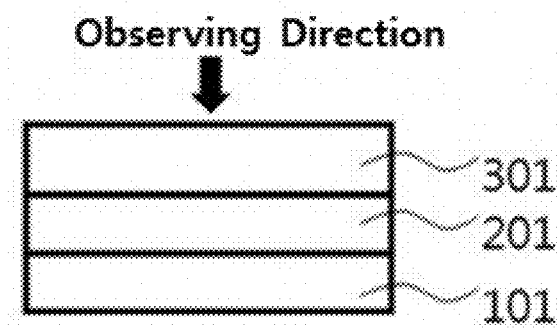
[FIG. 12(b)]
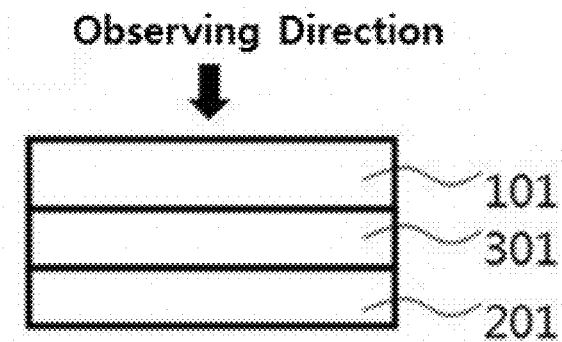

[FIG. 13(a)] 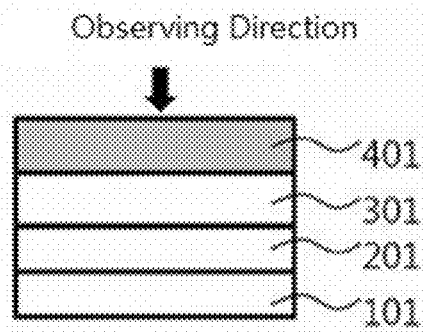
[FIG. 13(b)] 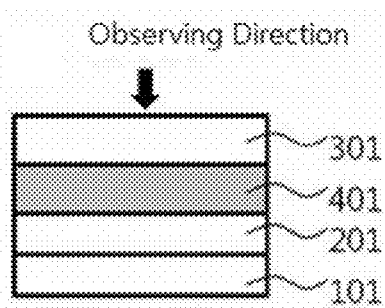
[FIG. 13(c)] 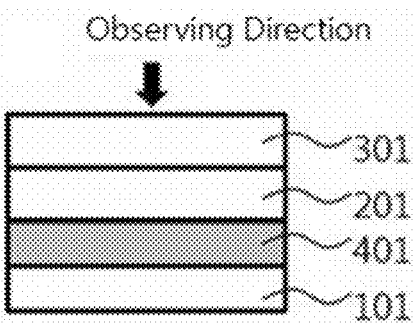
[FIG. 13(d)] 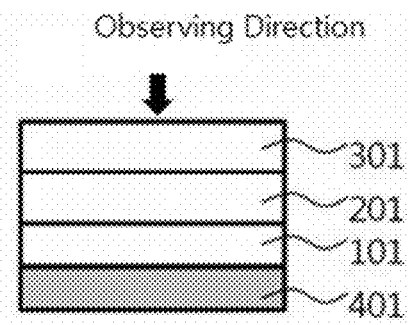
[FIG. 13(e)] 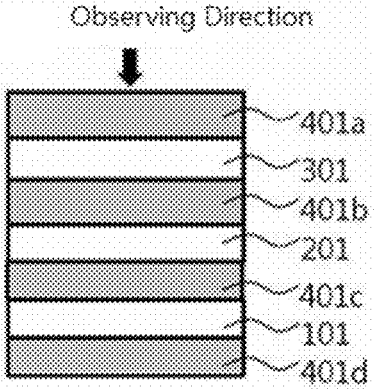

[FIG. 14(a)]
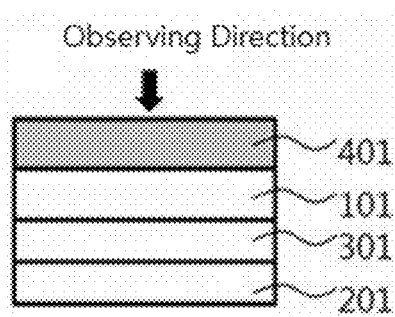
[FIG. 14(b)]
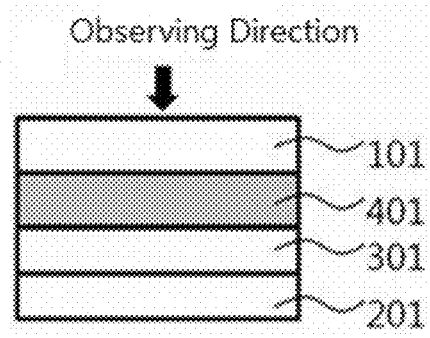
[FIG. 14(c)]
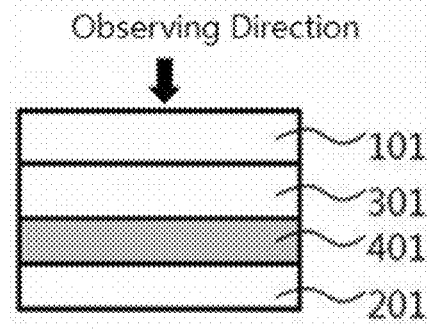
[FIG. 14(d)]
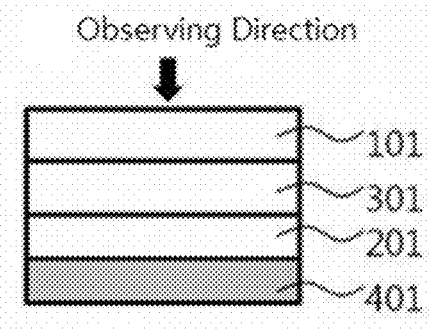
[FIG. 14(e)]
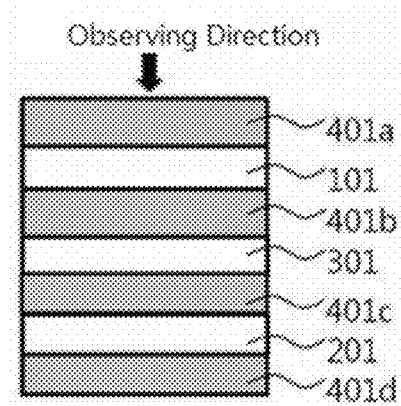

[FIG. 15]
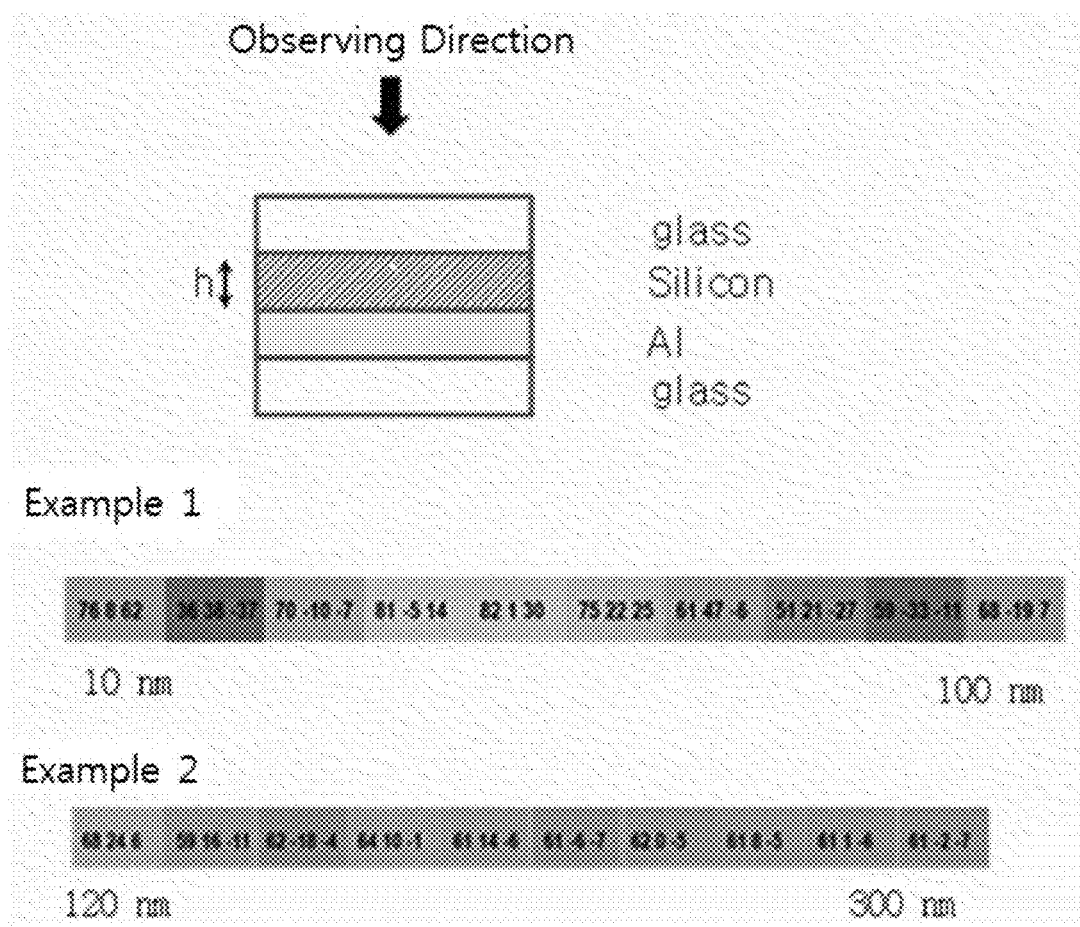

[FIG. 16]
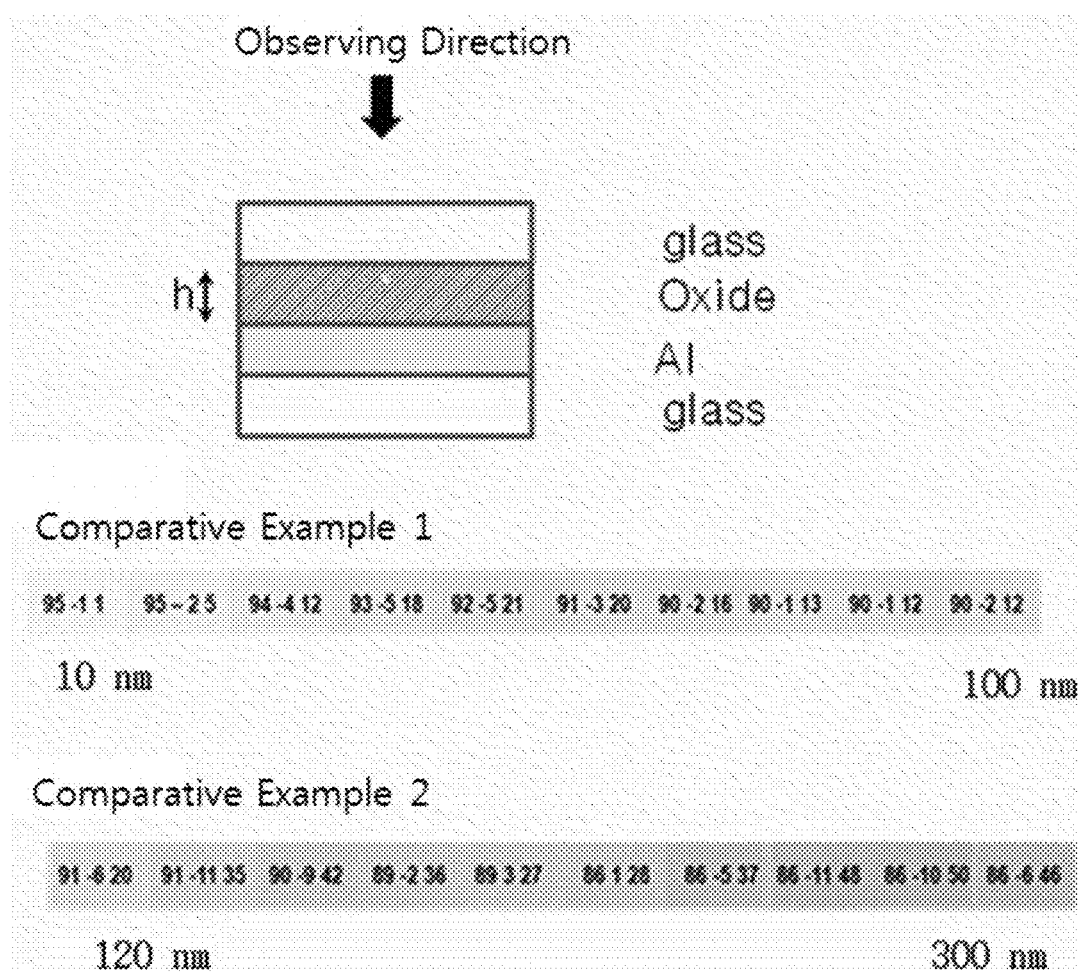

[FIG. 17]
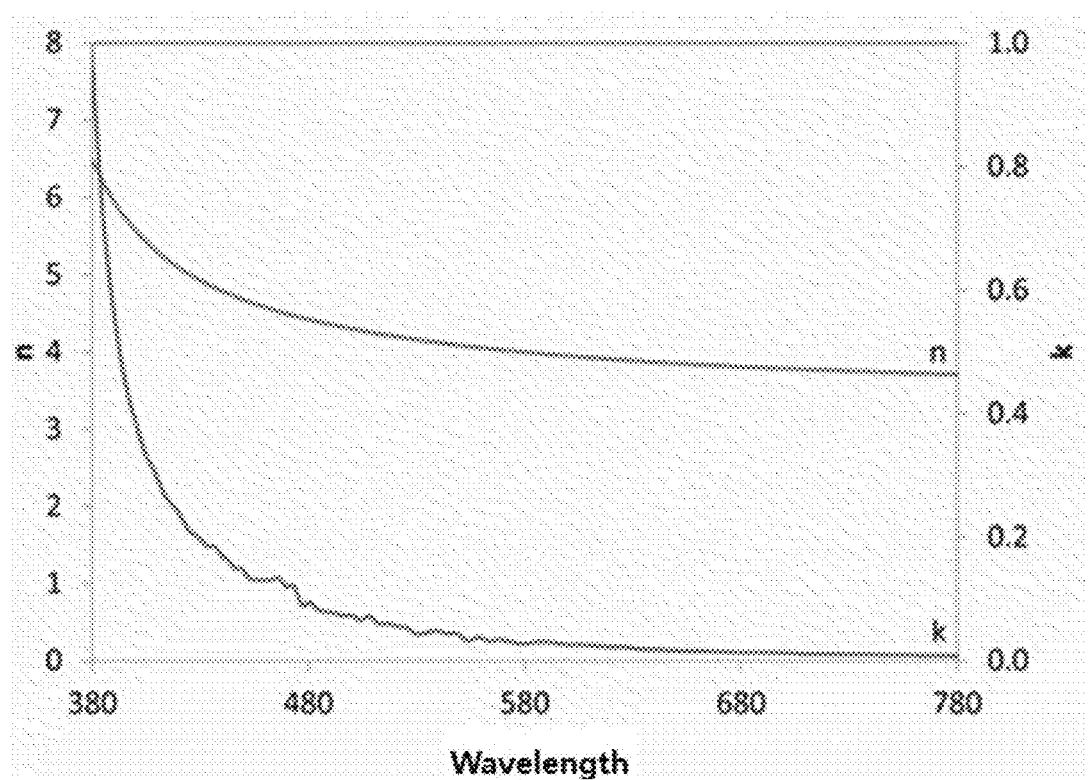

[FIG. 18]
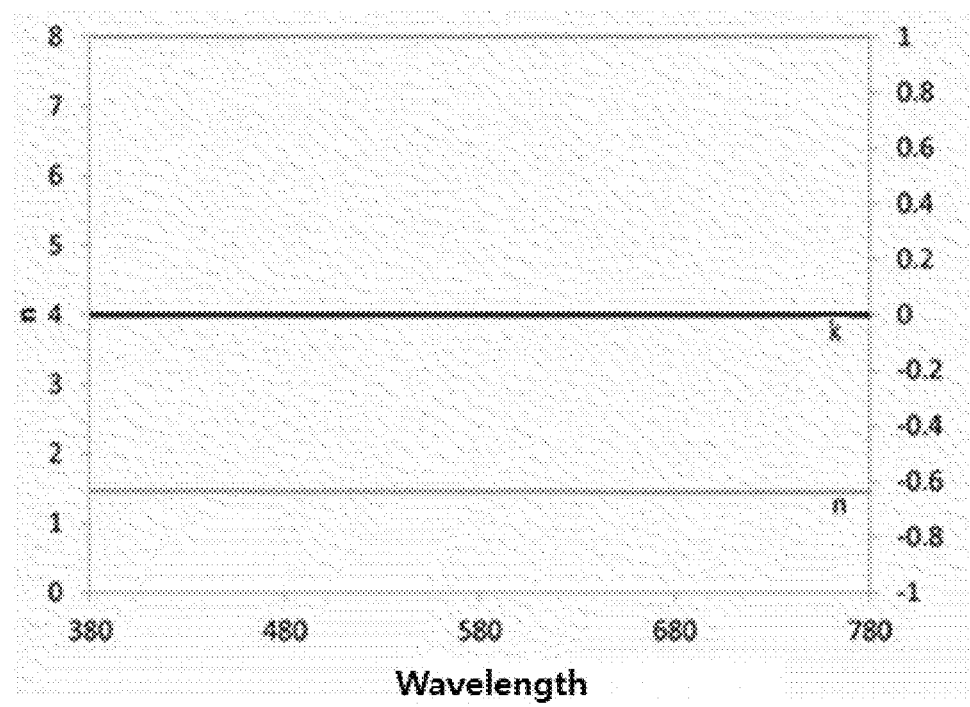
[FIG. 19]
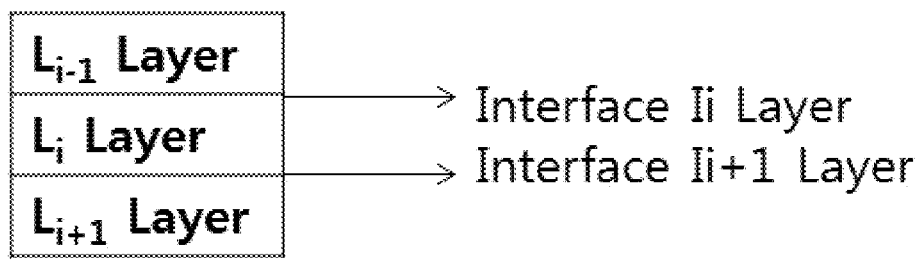

us 11,559,966 B2

DECORATIVE MEMBER AND MANUFACTURING METHOD THEREFOR

CROSS-REFERENCE TO RELATED APPLICATIONS

This application is the U.S. national stage of international application No. PCT/KR2018/007284 filed Jun. 27, 2018, and claims priority to and the benefits of Korean Patent Application No. 10-2017-0081419, filed with the Korean Intellectual Property Office on Jun. 27, 2017, and Korean Patent Application No. 10-2017-0136828, filed with the Korean Intellectual Property Office on Oct. 20, 2017, the entire contents of which are incorporated herein by reference.

TECHNICAL FIELD

The present disclosure relates to a decoration element and a method for preparing the same. In particular, the present disclosure relates to a decoration element suitable to be used in mobile devices or electronic products, and a method for preparing the same.

BACKGROUND ART

For mobile phones, various mobile devices and electronic products, product designs such as colors, shapes and patterns play a major role in providing values of products to customers in addition to product functions. Product preferences and prices are also dependent on designs.

As for mobile phones as one example, various colors and color senses are obtained using various methods and used in products. A method of providing colors to a mobile phone case material itself or a method of providing designs by attaching a deco film implementing colors and shapes to a case material may be included.

In existing deco films, attempts have been made to develop colors through methods such as printing and deposition. When expressing heterogeneous colors on a single surface, printing needs to be conducted two or more times, and implementation is hardly realistic when to apply various colors to a three-dimensional pattern. In addition, existing deco films have fixed colors depending on a viewing angle, and even when there is a slight change, the change is limited to just a difference in the color sense.

DISCLOSURE

Technical Problem

The present disclosure is directed to providing a decoration element capable of readily obtaining various colors, capable of obtaining a number of colors on a three-dimensional pattern as necessary, and capable of providing color changes depending on a viewing angle.

Technical Solution

One embodiment of the present application provides a decoration element comprising a light reflective layer, and a light absorbing layer provided on the light reflective layer and comprising Si.

According to another embodiment of the present application, a color film may be provided on a surface opposite to the surface facing the light absorbing layer of the light reflective layer, between the light reflective layer and the light absorbing layer, or on a surface opposite to the surface facing the light reflective layer of the light absorbing layer.

According to another embodiment of the present application, the color film employs a color difference ΔE*ab, a distance in space of L*a*b* in a color coordinate CIE L*a*b* of the decoration element, to be greater than 1 when the color film is present compared to when the color film is not provided.

According to another embodiment of the present application, a substrate is provided on a surface opposite to the surface facing the light absorbing layer of the light reflective layer, or on a surface opposite to the surface facing the light reflective layer of the light absorbing layer. The substrate may be provided on a surface opposite to the surface facing the light absorbing layer of the light reflective layer, and the color film may be provided between the substrate and the light reflective layer, or on a surface opposite to the surface facing the light reflective layer of the substrate. The substrate may be provided on a surface opposite to the surface facing the light reflective layer of the light absorbing layer, and the color film may be provided between the substrate and the light absorbing layer, or on a surface opposite to the surface facing the light absorbing layer of the substrate.

According to another embodiment of the present application, the light absorbing layer comprises two or more points with different thicknesses.

According to another embodiment of the present application, the light absorbing layer comprises two or more regions with different thicknesses.

According to another embodiment of the present application, the light absorbing layer comprises one or more regions in which an upper surface has an inclined surface with an inclined angle of greater than 0 degrees and less than or equal to 90 degrees, and the light absorbing layer comprises one or more regions having a thickness different from a thickness in any one region having the inclined surface.

According to another embodiment of the present application, the light absorbing layer comprises one or more regions with a gradually changing thickness.

According to another embodiment of the present application, the light absorbing layer comprises one or more regions in which an upper surface has an inclined surface with an inclined angle of greater than 0 degrees and less than or equal to 90 degrees, and at least one region having the inclined surface has a structure in which a thickness of the light absorbing layer gradually changes.

According to another embodiment of the present application, the light absorbing layer has an extinction coefficient (k) value of greater than 0 and less than or equal to 4, preferably 0.01 to 4 at 400 nm.

According to another embodiment of the present application, the decoration element is a deco film, a case of a mobile device, a case of an electronic product, or a commodity requiring color decoration.

DESCRIPTION OF DRAWINGS

FIG. 1 illustrates a laminated structure of a decoration element according to one embodiment of the present disclosure.

FIG. 2 is a mimetic diagram for describing a working principle of color development in a light reflective layer and light absorbing layer structure.

FIG. 3 to FIG. 6 illustrate a laminated structure of a decoration element according to embodiments of the present disclosure.

FIG. 7 to FIG. 10 illustrate an upper surface structure of a light absorbing layer of a decoration element according to embodiments of the present application.

FIG. 11 to FIG. 14 illustrate a laminated structure of a decoration element according to embodiments of the present disclosure.

FIG. 15 and FIG. 16 each show colors of decoration elements prepared in examples and comparative examples.

FIG. 17 is a graph showing a refractive index (n) and an extinction coefficient (k) of silicon.

FIG. 18 is a graph showing a refractive index (n) and an extinction coefficient (k) of silicon oxide.

FIG. 19 is a diagram showing a method of discriminating a light absorbing layer and a light reflective layer.

ADVANTAGEOUS EFFECTS

According to embodiments described in the present specification, light absorption occurs in each of an entering path when external light enters through a decoration element and in a reflection path when reflected, and since external light is reflected on each of a light absorbing layer surface and a light reflective layer surface, constructive interference and destructive interference phenomena occur between reflected light on the light absorbing layer surface and reflected light on the light reflective layer surface. Specific colors may be developed through such light absorption in the entering path and the reflection path, and the constructive interference and destructive interference phenomena. Accordingly, specific colors may be obtained according to light reflective layer material-dependent reflectance spectra and according to light absorbing layer compositions. In addition, since developed colors are thickness dependent, colors may vary depending on thicknesses even when having the same material composition. Particularly, when the light absorbing layer is formed with Si that is a single material, composition uniformity obtained from a single material can be secured unlike a composite material prepared through an interaction between a target material and a gas.

In addition, when further comprising a color film, the width of obtainable colors can be further increased much even when materials and thicknesses of the light reflective layer and the light absorbing layer are determined. The width of color changes obtained by the color film addition may be defined by a color difference (ΔE*ab), a difference in L*a*b* before and after applying the color film. Furthermore, a plurality of colors can be developed by allowing the light absorbing layer to have two or more points or regions with different thicknesses on the same surface, and by forming a decoration element on a three-dimensional pattern, various colors can be obtained in the three-dimensional pattern.

In addition, when an upper surface of the light absorbing layer has at least one inclined surface, changes in the developed colors can be obtained depending on a viewing angle, and the light absorbing layer can be prepared to have two or more regions with different thicknesses using a simple process.

MODE FOR DISCLOSURE

Hereinafter, the present disclosure will be described in detail.

In the present specification, a "point" means one position that does not have an area. In the present specification, the expression is used to indicate that a light absorbing layer has two or more points with different thicknesses.

In the present specification, a "region" represents a part having a certain area. For example, when placing the decoration element on the ground so that a light reflective layer is placed at the bottom and the light absorbing layer is placed at the top and dividing both ends of the inclined surface or both ends with the same thickness perpendicular with respect to the ground, the region having an inclined surface means an area divided by the both ends of the inclined surface, and the region with the same thickness means an area divided by the both ends with the same thickness.

In the present specification, a "surface" or "region" may be a flat surface, but is not limited thereto, and a part or all may be a curved surface. For example, structures in which a vertical cross-section shape is a part of an arc of a circle or oval, a wave structure, a zigzag or the like may be included.

In the present specification, an "inclined surface" means, when placing the decoration member on the ground so that a light reflective layer is placed at the bottom and the light absorbing layer is placed at the top, a surface having an angle formed by the upper surface with respect to the ground of greater than 0 degrees and less than or equal to 90 degrees.

In the present specification, a "thickness" of a certain layer means a shortest distance from a lower surface to an upper surface of the corresponding layer.

In the present specification, "or" represents, unless defined otherwise, a case of selectively or all comprising those listed, that is, a meaning of "and/or".

In the present specification, a "layer" means covering 70% or more of an area where the corresponding layer is present. It means covering preferably 75% or more, and more preferably 80% or more. A decoration element according to one embodiment of the present application comprises a light reflective layer, and a light absorbing layer provided on the light reflective layer and comprising Si. FIG. 1 illustrates a structure of the decoration element comprising a light reflective layer (201) and a light absorbing layer (301). Herein, the light absorbing layer (301) comprises Si. The light absorbing layer (301) comprises Si itself, not an oxide or a nitride of Si.

Through FIG. 19, the light absorbing layer and the light reflective layer are described. In the decoration element of FIG. 19, each layer is laminated in order of a $L_{i-1}$ layer, a $L_i$ layer and a $L_{i+1}$ layer based on a light entering direction, an interface $I_i$ is located between the $L_{i-1}$ layer and the $L_i$ layer, and an interface $I_{i+1}$ is located between the $L_i$ layer and the $L_{i+1}$ layer.

When irradiating light having a specific wavelength in a direction perpendicular to each layer so that thin film interference does not occur, reflectance at the interface $I_i$ may be expressed by the following Mathematical Equation 1.

$$\frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2}$$

[Mathematical Equation 1]

In Mathematical Equation 1, $n_i(\lambda)$ means a refractive index depending on the wavelength (λ) of the $i^{th}$ layer, and $k_i(\lambda)$ means an extinction coefficient depending on the wavelength (λ) of the $i^{th}$ layer. The extinction coefficient is a measure capable of defining how strongly a subject material absorbs light at a specific wavelength, and the definition is as described above.

Using Mathematical Equation 1, when a sum of reflectance for each wavelength at the interface $I_i$ calculated at each wavelength is $R_i$, $R_i$ is as in the following Mathematical Equation 2.

$$R_i = \frac{\sum_{\lambda=380\,nm}^{\lambda=780\,nm} \frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \Delta\lambda}{\sum_{\lambda=380\,nm}^{\lambda=780\,nm} \Delta\lambda}$$ [Mathematical Equation 2]

According to one embodiment, the light absorbing layer comprising Si may be formed only with Si.

According to one embodiment, the light absorbing layer may be formed only with Si, or may be formed with an alloy of Si and a metal.

According to another embodiment, the light absorbing layer comprising Si may also be formed with, in addition to Si, an alloy layer of Si and a metal. The metal that may be used in the alloy may be Al, Cu, Ti, Mo or the like, but is not limited thereto.

The light absorbing layer comprising Si may be formed using a deposition method. The deposition method comprises methods of sputtering, evaporation, plating, atomic layer deposition (ALD), aerosol spray and the like.

The light absorbing layer comprising Si has an extinction coefficient (k) at 400 nm, preferably 380 nm to 780 nm, and for example, the extinction coefficient may be from 0.01 to 4, from 0.01 to 3.5, from 0.01 to 3, or from 0.01 to 1.

According to one embodiment, the light absorbing layer may be a single layer, or a multilayer of two or more layers.

According to the embodiments, light absorption occurs in an entering path and a reflection path of light in the light absorbing layer, and by the light reflecting on each of a surface of the light absorbing layer and an interface of the light absorbing layer and the light reflective layer, the two reflected lights go through constructive or destructive interference. In the present specification, the light reflected on the surface of the light absorbing layer may be expressed as surface reflected light, and the light reflected on the interface of the light absorbing layer and the light reflective layer may be expressed as interface reflected light. A mimetic diagram of such a working principle is illustrated in FIG. 2. FIG. 2 illustrates a structure in which a substrate (101) is provided on a light reflective layer (201) side, however, the structure is not limited to such a structure, and as for the substrate (101) location, the substrate may be disposed on other locations as to be described below.

According to another embodiment of the present application, when the light absorbing layer comprises a pattern, the pattern may have a symmetric structure, an asymmetric structure or a combination thereof.

According to one embodiment, the light absorbing layer may comprise a symmetric-structured pattern. As the symmetric structure, a prism structure, a lenticular lens structure and the like are included.

According to another embodiment of the present application, the light absorbing layer may comprise an asymmetric-structured pattern.

In the present specification, the asymmetric-structured pattern means having an asymmetric structure on at least one surface when observing from an upper surface, a side surface or a cross-section. The decoration member may develop dichroism when having such an asymmetric structure. Dichroism means different colors being observed depending on a viewing angle.

Dichroism may be expressed by $\Delta E^*ab = \sqrt{\{(\Delta L)^2 + (\Delta a)^2 + (\Delta b)^2\}}$ relating to the color difference described above, and a viewing angle-dependent color difference being $\Delta E^*ab > 1$ may be defined as having dichroism.

According to one embodiment, the light absorbing layer may have dichroism of $\Delta E^*ab > 1$.

According to one embodiment, an upper surface of the light absorbing layer may comprise a pattern having a cone-shaped protrusion or groove, a pattern having a protrusion in which the highest point has a line shape or a groove in which the lowest point has a line shape, or a pattern having a protrusion or groove with a structure in which the cone-shaped upper surface is cut.

According to one embodiment, the light absorbing layer comprises a pattern in which an upper surface has a cone-shaped protrusion or groove. The cone shape comprises a shape of a circular cone, an oval cone or a polypyramid. Herein, the shape of the bottom surface of the polypyramid comprises a triangle, a square, a star shape having 5 or more protruding points, and the like. The cone shape may have a shape of a protrusion formed on an upper surface of the light absorbing layer, or a shape of a groove formed on an upper surface of the light absorbing layer. The protrusion has a triangular cross-section, and the groove has an inverted triangular cross-section. A lower surface of the light absorbing layer may also have the same shape as the upper surface of the light absorbing layer.

According to one embodiment, the cone-shaped pattern may have an asymmetric structure. For example, when rotating the cone-shaped pattern 360 degrees based on the vertex of the cone and observing from the upper surface, dichroism is difficult to be developed from the pattern when three or more same shapes are present. However, when rotating the cone-shaped pattern 360 degrees based on the vertex of the cone and observing from the upper surface, dichroism may be developed when two or less same shapes are present. FIG. 7 illustrates an upper surface of the cone shape, and (a) all illustrates a symmetric-structured cone shape, and (b) illustrates an asymmetric-structured cone shape.

The symmetric-structured cone shape has a structure in which a cone-shaped bottom surface is a circle or a regular polygon having the same side lengths, and the vertex of the cone is present on a vertical line of the center of gravity of the bottom surface. However, the asymmetric-structured cone shape has a structure in which, when observing from the upper surface, the position of the vertex of the cone is present on a vertical line of a point that is not the center of gravity of the bottom surface, or has a structure in which the bottom surface is an asymmetric-structured polygon or oval. When the bottom surface is an asymmetric-structured polygon, at least one of the sides and the angles of the polygon may be designed to be different from the rest.

For example, as in FIG. 8, the position of the vertex of the cone may be changed. Specifically, when designing the vertex of the cone to be located on a vertical line of the center of gravity (O1) of the bottom surface when observing from the upper surface as in the first drawing of FIG. 8, 4 identical structures may be obtained when rotating 360 degrees based on the vertex of the cone (4-fold symmetry). However, the symmetric structure is broken by designing the vertex of the cone on a position (O2) that is not the center of gravity (O1) of the bottom surface. When employing a length of one side of the bottom surface as x, migration distances of the vertex of the cone as a and b, a height of the cone shape, a length of a line vertically connecting from the vertex of the cone (O1 or O2) to the bottom surface, as h, and an angle formed by the bottom surface and a side surface of the cone as θn, cosine values for Surface 1, Surface 2, Surface 3 and Surface 4 of FIG. 8 may be obtained as follows.

$$\cos(\Theta 1) = \frac{\left(\frac{x}{2}\right)}{sqrt\left(h^2 + \left(\frac{x}{2}\right)^2\right)}$$

$$\cos(\Theta 3) = \frac{\left(\frac{x}{2} - a\right)}{sqrt\left(h^2 + \left(\frac{x}{2} - a\right)^2\right)}$$

$$\cos(\Theta 2) = \frac{\left(\frac{x}{2}\right)}{sqrt\left(h^2 + \left(\frac{x}{2}\right)^2\right)}$$

$$\cos(\Theta 4) = \frac{\left(\frac{x}{2} - b\right)}{sqrt\left(h^2 + \left(\frac{x}{2} - b\right)^2\right)}$$

Herein, θ1 and θ2 are the same, and therefore, there is no dichroism. However, θ3 and θ4 are different, and |θ3−θ4| means a color difference between two colors (E*ab), and therefore, dichroism may be obtained. Herein, |θ3−θ4|>0. As above, how much the symmetric structure is broken, that is, a degree of asymmetry, may be represented quantitatively using an angle formed by the bottom surface and a side surface of the cone, and the value representing such a degree of asymmetry is proportional to a color difference of dichroism.

According to another embodiment, the light absorbing layer comprises a pattern having a protrusion in which the highest point has a line shape or a groove in which the lowest point has a line shape. The line shape may be a straight-line shape or a curved-line shape, and may comprise both a curved line and a straight line. When rotating the pattern having a line-shaped protrusion or groove 360 degrees based on the center of gravity of an upper surface and observing from the upper surface, dichroism is difficult to be developed when two or more same shapes are present. However, when rotating the pattern having a line-shaped protrusion or groove 360 degrees based on the center of gravity of an upper surface and observing from the upper surface, dichroism may be developed when only one same shape is present. FIGS. 9(a) and 9(b) illustrate an upper surface of a pattern having a line-shaped protrusion. FIG. 9(a) illustrates a pattern having a line-shaped protrusion developing no dichroism and FIG. 9(b) illustrates a pattern having a line-shaped protrusion developing dichroism. An X-X' cross-section of FIG. 9(a) is an isosceles triangle or an equilateral triangle, and a Y-Y' cross-section of FIG. 9(b) is a triangle having different side lengths.

According to another embodiment, the light absorbing layer comprises a pattern in which an upper surface has a protrusion or groove with a structure in which the cone-shaped upper surface is cut. Such a cross-section of the pattern may have a trapezoidal or inversed trapezoidal shape. In this case, dichroism may also be developed by designing the upper surface, the side surface or the cross-section to have an asymmetric structure.

In addition to the structure illustrated above, various protrusion or groove patterns as in FIG. 10 may be obtained.

According to another embodiment of the present application, the light absorbing layer may comprise two or more regions with different thicknesses.

Examples of the structure according to the embodiment are illustrated in FIG. 3 and FIG. 4. FIG. 3 and FIG. 4 illustrate a structure in which a light reflective layer (201) and a light absorbing layer (301) are laminated. The substrate (101) may be provided on the light reflective layer (201) side, or may also be provided on the light absorbing layer (301) side. According to FIG. 3 and FIG. 4, the light absorbing layer (301) has two or more points with different thicknesses. According to FIG. 3, thicknesses in A region and B region are different in the light absorbing layer (301). According to FIG. 4, thicknesses in C region and D region are different in the light absorbing layer (301).

According to another embodiment of the present application, the light absorbing layer comprises one or more regions in which an upper surface has an inclined surface with an inclined angle of greater than 0 degrees and less than or equal to 90 degrees, and the light absorbing layer comprises one or more regions having a thickness different from a thickness in any one region having the inclined surface.

Surface properties such as an upper surface slope of the light reflective layer may be the same as an upper surface of the light absorbing layer. For example, by using a deposition method when forming the light absorbing layer, the upper surface of the light absorbing layer may have the same slope as the upper surface of the light reflective layer.

FIG. 5 illustrates a structure of a decoration element having a light absorbing layer in which an upper surface has an inclined surface. The structure is a structure laminating a substrate (101), a light reflective layer (201) and a light absorbing layer (301), and thickness t1 in E region and thickness t2 in F region are different in the light absorbing layer (301).

FIG. 5 relates to a light absorbing layer having inclined surfaces facing each other, which is, having a structure with a triangle cross-section. In the structure of the pattern having inclined surfaces facing each other as in FIG. 5, a thickness of the light absorbing layer may be different in two surfaces of the triangle structure even when progressing deposition under the same condition. Accordingly, a light absorbing layer having two or more regions with different thicknesses may be formed using just one process. As a result, developed colors may become different depending on the thickness of the light absorbing layer. Herein, the thickness of the light reflective layer does not affect changes in the color when it is a certain thickness or greater.

FIG. 5 illustrates a structure in which the substrate (101) is provided on the light reflective layer (201) side, however, the structure is not limited thereto, and as described above, the substrate (101) may also be disposed on other locations. In addition, in FIG. 5, the surface adjoining the light reflective layer (201) of the substrate (101) is a flat surface, however, the surface adjoining the light reflective layer (201) of the substrate (101) may have a pattern having the same slope as an upper surface of the light reflective layer (201). This may cause a difference in the thickness of the light absorbing layer due to a difference in the slope of the pattern of the substrate. However, the present disclosure is not limited thereto, and even when the substrate and the light absorbing layer are prepared to have different slopes using different deposition methods, the dichroism described above may be obtained by having the thickness of the light absorbing layer being different on both sides of the pattern.

According to another embodiment of the present application, the light absorbing layer comprises one or more regions with a gradually changing thickness. FIG. 3 illustrates a structure in which a thickness of the light absorbing layer gradually changes.

According to another embodiment of the present application, the light absorbing layer comprises one or more regions in which an upper surface has an inclined surface with an inclined angle of greater than 0 degrees and less than or equal to 90 degrees, and at least one region having the inclined surface has a structure in which a thickness of the light absorbing layer gradually changes. FIG. 6 illustrates a structure of a light absorbing layer comprising a region in which an upper surface has an inclined surface. In FIG. 6, both G region and H region have a structure in which an upper surface of the light absorbing layer has an inclined surface, and a thickness of the light absorbing layer gradually changes.

According to one embodiment, the light absorbing layer comprises a first region having a first inclined surface with an inclined angle in a range of 1 degrees to 90 degrees, and may further comprise a second region in which an upper surface has an inclined surface with a different slope direction or a different inclined angle from the first inclined surface, or an upper surface is horizontal. Herein, thicknesses in the first region and the second region may be different from each other in the light absorbing layer.

According to another embodiment, the light absorbing layer comprises a first region having a first inclined surface with an inclined angle in a range of 1 degrees to 90 degrees, and may further comprise two or more regions in which an upper surface has an inclined surface with a different slope direction or a different inclined angle from the first inclined surface, or an upper surface is horizontal. Herein, thicknesses in the first region and the two or more regions may all be different from each other in the light absorbing layer.

According to another embodiment of the present application, the decoration element comprises a color film provided on a surface opposite to the surface facing the light absorbing layer of the light reflective layer, between the light reflective layer and the light absorbing layer, or on a surface opposite to the surface facing the light reflective layer of the light absorbing layer.

When the color film is present compared to when the color film is not provided, the color film is not particularly limited as long as it has a color difference ΔE*ab, a distance in space of L*a*b* in a color coordinate CIE L*a*b* of the decoration element, of greater than 1.

Colors may be expressed by CIE L*a*b*, and a color difference may be defined using a distance (ΔE*ab) in the L*a*b* space. Specifically, the color difference is $\Delta E^*ab = \sqrt{\{(\Delta L)^2 + (\Delta a)^2 + (\Delta b)^2\}}$, and within a range of 0<ΔE*ab<1, an observer may not recognize the color difference [reference document: Machine Graphics and Vision 20(4):383-411]. Accordingly, a color difference obtained by the color film addition may be defined by ΔE*ab>1 in the present specification.

FIG. 11 illustrates a color conversion layer comprising a color film, and FIG. 11(a) illustrates a structure in which a light reflective layer (201), a light absorbing layer (301) and a color film (401) are consecutively laminated, FIG. 11(b) illustrates a structure in which a light reflective layer (201), a color film (401) and a light absorbing layer (301) are consecutively laminated, and FIG. 11(c) illustrates a structure in which a color film (401), a light reflective layer (201) and a light absorbing layer (301) are consecutively laminated.

The color film may also perform a role of a substrate. For example, those that may be used as a substrate may be used as a color film by adding a pigment or a dye thereto.

The substrate may be provided on a surface opposite to the surface facing the light absorbing layer of the light reflective layer (FIG. 12(a)); or on a surface opposite to the surface facing the light reflective layer of the light absorbing layer (FIG. 12(b)).

For example, when the substrate is provided on a surface opposite to the surface facing the light absorbing layer of the light reflective layer, and the color film is located on a surface opposite to the surface facing the light absorbing layer of the light reflective layer, the color film may be provided between the substrate and the light reflective layer; or on a surface opposite to the surface facing the light reflective layer of the substrate. As another example, when the substrate is provided on a surface opposite to the surface facing the light reflective layer of the light absorbing layer, and the color film is located on a surface opposite to the surface facing the light reflective layer of the light absorbing layer, the color film may be provided between the substrate and the light absorbing layer; or on a surface opposite to the surface facing the light absorbing layer of the substrate.

According to one embodiment of the present application, the substrate is provided on a surface opposite to the surface facing the light absorbing layer of the light reflective layer, and the color film is further provided. FIG. 13(a) illustrates a structure in which the color film (401) is provided on a surface opposite to the light reflective layer (201) side of the light absorbing layer (301), FIG. 13(b) illustrates a structure in which the color film (401) is provided between the light absorbing layer (301) and the light reflective layer (201), FIG. 13(c) illustrates a structure in which the color film (401) is provided between the light reflective layer (201) and the substrate (101), and FIG. 13(d) illustrates a structure in which the color film (401) is provided on a surface opposite to the light reflective layer (201) side of the substrate (101). FIG. 13(e) illustrates a structure in which the color films (401a, 401b, 401c, 401d) are provided on a surface opposite to the light reflective layer (201) side of the light absorbing layer (301), between the light absorbing layer (301) and the light reflective layer (201), between the light reflective layer (201) and the substrate (101), and on a surface opposite to the light reflective layer (201) side of the substrate (101), respectively, however, the structure is not limited thereto, and 1 to 3 of the color films (401a, 401b, 401c, 401d) may not be included.

According to another embodiment of the present application, the substrate is provided on a surface opposite to the surface facing the light reflective layer of the light absorbing layer, and the color film is further provided. FIG. 14(a) illustrates a structure in which the color film (401) is provided on a surface opposite to the light absorbing layer (301) side of the substrate (101), FIG. 14(b) illustrates a structure in which the color film (401) is provided between the substrate (101) and the light absorbing layer (301), FIG. 14(c) illustrates a structure in which the color film (401) is provided between the light absorbing layer (301) and the light reflective layer (201), and FIG. 14(d) illustrates a structure in which the color film (401) is provided on a surface opposite to the light absorbing layer (301) side of the light reflective layer (201). FIG. 14(e) illustrates a structure in which the color films (401a, 401b, 401c, 401d) are provided on a surface opposite to the light absorbing layer (201) side of the substrate (101), between the substrate (101) and the light absorbing layer (301), between the light absorbing layer (301) and the light reflective layer (201), and on a surface opposite to the light absorbing layer (201) side of the light reflective layer (201), respectively, however, the structure is not limited thereto, and 1 to 3 of the color films (401a, 401b, 401c, 401d) may not be included.

In the structures such as FIG. 13(b) and FIG. 14(c), the light reflective layer may reflect light entering through the color film when the color film has visible light transmittance of greater than 0%, and therefore, colors may be obtained by laminating the light absorbing layer and the light reflective layer.

In the structures such as FIG. 13(c), FIG. 13(d) and FIG. 14(d), light transmittance of the colors developed from the color film of the light reflective layer (201) may be 1% or greater, preferably 3% or greater and more preferably 5% or greater so that changes in the color difference obtained by the color film addition may be recognized. This is due to the fact that light transmitted in such a visible light transmittance range may be mixed with colors obtained by the color film.

The color film may be provided as one sheet, or as a laminate of 2 sheets or more that are the same or different types.

As the color film, those capable of developing target colors by combining with colors developed from the laminated structure of the light reflective layer and the light absorbing layer described above may be used. For example, color films expressing colors by one, two or more types of pigments and dyes being dispersed into a matrix resin may be used. Such a color film may be formed by directly coating a composition for forming a color film on a color film-providable location, or a method of preparing a color film by coating a composition for forming a color film on a separate substrate or using a known molding method such as casting or extrusion, and then disposing or attaching the color film on a color film-providable location may be used. As the coating method, wet coating or dry coating may be used.

The pigment and the dye capable of being included in the color film may be selected from among those capable of obtaining target colors from a final decoration member, and known in the art, and one, two or more types among pigments and dyes such as red-based, yellow-based, purple-based, blue-based or pink-based may be used. Specifically, dyes such as perinone-based red dyes, anthraquinone-based red dyes, methane-based yellow dyes, anthraquinone-based yellow dyes, anthraquinone-based purple dyes, phthalocyanine-based blue dyes, thioindigo-based pink dyes or isoxindigo-based pink dyes may be used either alone or as a combination. Pigments such as carbon black, copper phthalocyanine (C.I. Pigment Blue 15:3), C.I. Pigment Red 112, Pigment blue or isoindoline yellow may be used either alone or as a combination. As such dyes or pigments, those commercially available may be used, and for example, materials manufactured by Ciba ORACET or Chokwang Paint Ltd. may be used. Types of the dyes or pigments and colors thereof are for illustrative purposes only, and various known dyes or pigments may be used, and more diverse colors may be obtained therefrom.

As the matrix resin included in the color film, materials known as materials of transparent films, primer layers, adhesive layers or coating layers may be used, and the matrix resin is not particularly limited to these materials. For example, various materials such as acryl-based resins, polyethylene terephthalate-based resins, urethane-based resins, linear olefin-based resins, cycloolefin-based resins, epoxy-based resins or triacetylcellulose-based resins may be selected, and copolymers or mixtures of the materials illustrated above may also be used.

When the color film is disposed closer to the location observing a decoration member than the light reflective layer or the light absorbing layer as in, for example, the structures of FIGS. 13(a) and (b), and FIGS. 14(a), (b) and (c), light transmittance of the colors developed by the color film from the light reflective layer, the light absorbing layer or the laminated structure of the light reflective layer and the light absorbing layer may be 1% or greater, preferably 2% or greater and more preferably 3% or greater. As a result, target colors may be obtained by combining colors developed from the color film and colors developed from the light reflective layer, the light absorbing layer or the laminated structure thereof.

The thickness of the color film is not particularly limited, and those skilled in the art may select and set the thickness as long as it is capable of obtaining target colors. For example, the color film may have a thickness of 500 nm to 1 mm.

The light absorbing layer may implement various colors depending on a refractive index (n), an extinction coefficient (k) and a thickness (t). In addition, it is seen that various colors may be obtained by adjusting a thickness of the light absorbing layer and an inclined angle of the upper surface. By being provided with a color film in addition thereto, more diverse colors may be obtained.

The light reflective layer is not particularly limited as long as it is a material capable of reflecting light, however, light reflectance may be determined depending on the material, and for example, colors are readily expressed at 50% or greater. Light reflectance may be measured using an ellipsometer.

The light absorbing layer preferably has a refractive index (n) of 0 to 8 at 400 nm, and the refractive index may be from 0 to 7, may be from 0.01 to 3, and may be from 2 to 2.5. The refractive index (n) may be calculated by $\sin\theta_1/\sin\theta_2$ ($\theta_1$ is an angle of light incident on a surface of the light absorbing layer, and $\theta_2$ is a refraction angle of light inside the light absorbing layer).

The light absorbing layer preferably has a refractive index (n) of 0 to 8 at 380 nm to 780 nm, and the refractive index may be from 0 to 7, may be from 0.01 to 3, and may be from 2 to 2.5.

The light absorbing layer may have an extinction coefficient (k) of greater than 0 and less than or equal to 4 at 400 nm, and the extinction coefficient (k) is preferably from 0.01 to 4, may be from 0.01 to 3.5, may be from 0.01 to 3, and may be from 0.1 to 1. The extinction coefficient (k) is $-\lambda/4\pi I$ (dI/dx) (herein, a value multiplying $\lambda/4\pi$ with dI/I, a reduced fraction of light intensity per a path unit length (dx), for example 1 m, in the light absorbing layer, and herein, $\lambda$ is a wavelength of light).

The light absorbing layer may have an extinction coefficient (k) of greater than 0 and less than or equal to 4 at 380 nm to 780 nm, and the extinction coefficient (k) is preferably from 0.01 to 4, may be from 0.01 to 3.5, may be from 0.01 to 3, and may be from 0.1 to 1.

The extinction coefficient (k) is in the above-mentioned range at 400 nm, preferably in the whole visible wavelength region of 380 nm to 780 nm, and therefore, a role of the light absorbing layer may be performed in the whole visible light.

An extinction coefficient (k) and a refractive index (n) of silicon (Si) itself are shown in FIG. 7. At 380 nm to 780 nm, the refractive index is from 0 to 8, and the extinction coefficient is from 0.1 to 1, and specifically from 0.4 to 0.8.

For example, using a method of absorbing light by adding a dye to a resin, and using a material having an extinction coefficient as described above lead to different light absorption spectra. When absorbing light by adding a dye to a resin, an absorption wavelength band is fixed, and only a phenomenon of varying an absorption amount depending on the changes in the coating thickness occurs. In addition, in order to obtain a target light absorption amount, changes in the thickness of at least a few micrometers or more are required to adjust the light absorption amount. On the other hand, in materials having an extinction coefficient, a wavelength band absorbing light changes even when the thickness changes by a several to tens of nanometer scale.

According to one embodiment, the light reflective layer may be a metal layer, a metal oxide layer, a metal nitride layer, a metal oxynitride layer, a carbon or carbon composite layer, or an inorganic material layer. The light reflective layer may be formed in a single layer, or may be formed in a multilayer of two or more layers.

As one example, the light reflective layer may be a single layer or a multilayer comprising one, two or more types of materials selected from among indium (In), tin (Sn), silicon (Si), aluminum (Al), copper (Cu), nickel (Ni), vanadium (V), tungsten (W), tantalum (Ta), molybdenum (Mo), neodymium (Nd), titanium (Ti), iron (Fe), chromium (Cr), cobalt (Co), gold (Au) and silver (Ag), or oxides, nitrides or oxynitrides thereof, and one, two or more types of materials among carbon and carbon composites. For example, the light reflective layer may comprise two or more alloys selected from among the above-mentioned materials, or oxides, nitrides or oxynitrides thereof. More specifically, molybdenum, aluminum or copper may be included. According to another embodiment, the light reflective layer may allow highly resistant reflective layer by being prepared using an ink comprising carbon or carbon composites. Carbon black, CNT and the like may be included as the carbon or carbon composites. The ink comprising carbon or carbon composites may comprise above-described materials, or oxides, nitrides or oxynitrides thereof, and for example, one, two or more types of oxides selected from among indium (In), titanium (Ti), tin (Sn), silicon (Si), germanium (Ge). aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag) may be included. A curing process may be further carried out after printing the ink comprising carbon or carbon composites.

When the light reflective layer comprises two or more types of materials, the two or more types of materials may be formed using one process, for example, a method of deposition or printing, however, a method of first forming a layer using one or more types of materials, and then additionally forming a layer thereon using one or more types of materials may be used. For example, a light reflective layer may be formed by forming a layer through depositing indium or tin, then printing an ink comprising carbon, and then curing the result. The ink may further comprise oxides such as titanium oxides or silicon oxides.

According to one embodiment, the thickness of the light reflective layer may be determined depending on target color in a final structure, and for example, may be 1 nm or greater, preferably 25 nm or greater, for example, 50 nm or greater, and preferably 70 nm or greater.

According to one embodiment, the thickness of the light absorbing layer may be from 5 nm to 500 nm, for example, from 30 nm to 500 nm.

According to one embodiment, a difference in the thickness by the region of the light absorbing layer is from 2 nm to 200 nm, and may be determined depending on a target color difference.

According to one embodiment, a substrate provided on a lower surface of the light reflective layer or an upper surface of the light absorbing layer may be further included. Surface properties such as an upper surface slope of the substrate may be the same as upper surfaces of the light reflective layer and the light absorbing layer. By forming the light reflective layer and the light absorbing layer using a deposition method, the substrate, the light reflective layer and the light absorbing layer may have an inclined surface with the same angle. For example, the structure as above may be obtained by forming an inclined surface or a three-dimensional structure on an upper surface of a substrate, and depositing a light reflective layer and a light absorbing layer thereon in this order, or depositing a light absorbing layer and a light reflective layer in this order.

According to one embodiment, forming an inclined surface or a three-dimensional structure on the substrate surface may be carried out using a method of forming a pattern on an ultraviolet curable resin and curing the result using ultraviolet rays, or processing with laser. According to one embodiment, the decoration element may be a deco film or a case of a mobile device. The decoration element may further comprise a gluing layer as necessary.

Materials of the substrate are not particularly limited, and ultraviolet curable resins known in the art may be used when forming an inclined surface or a three-dimensional structure using methods as above.

On the light absorbing layer, a protective layer may be further provided.

According to one embodiment, an adhesive layer may be further provided on an opposite surface of the substrate provided with the light absorbing layer or the light reflective layer. This adhesive layer may be an optically clear adhesive (OCA) layer. As necessary, a peel-off layer (release liner) may be further provided on the adhesive layer for protection.

Deposition such as a sputtering method has been described as an example of forming the light reflective layer and the light absorbing layer in the present specification, however, various methods of preparing a thin film may be used as long as constitutions and properties according to embodiments described in the present specification are obtained. For example, a vapor deposition method, a chemical vapor deposition (CVD) method, wet coating and the like may be used.

Hereinafter, the present disclosure will be described in more detail with reference to examples. However, the following examples are for illustrative purposes only, and are not to limit the scope of the present disclosure.

EXAMPLE 1

After forming a light reflective layer (Al, thickness 120 nm) on a PET substrate by depositing Al using a sputtering method, a light absorbing layer formed with Si was formed thereon using sputtering method. The light absorbing layer was employed to have 10 types of thicknesses from 10 nm to 100 nm at an interval of 10 nm. Glass was disposed on the light absorbing layer. In such a structure, n and k values of Si were used, and results of color change simulation obtained from varying the Si thickness are shown in FIG. 15. Through FIG. 15, it was identified that various colors were obtained in a 10 nm to 100 nm range in Example 1 by the influence of Si having the k value. FIG. 17 is a graph showing the refractive index (n) and the extinction coefficient (k) of the silicon.

EXAMPLE 2

Preparation was performed in the same manner as in Example 1 except for increasing the light absorbing layer thickness from 120 nm to 300 nm increasing by 20 nm. In such a structure, results of color change simulation obtained from varying the Si thickness are shown in FIG. 15. Through FIG. 15, it was identified that various colors were obtained in a 120 nm to 300 nm range in Example 2 by the influence of Si having the k value.

COMPARATIVE EXAMPLES 1 AND 2

Preparation was performed in the same manner as in Examples 1 and 2 except that a light absorbing layer formed with silicon oxide was formed instead of forming the light absorbing layer only with Si. In such a structure, n and k values of the silicon oxide were used, and results of color change simulation obtained from varying the silicon oxide thickness are shown in FIG. 16. Through FIG. 16, it was identified that, in Comparative Examples 1 and 2, color changes were only caused by a refractive index with the influence of silicon oxide (expressed as oxide in FIG. 16) that does not have the k value, and changes in similar colors only appeared. FIG. 18 is a graph showing the refractive index (n) and the extinction coefficient (k) of the silicon oxide.

The invention claimed is:

1. A decoration element comprising:
a light reflective layer; and
a light absorbing layer provided on the light reflective layer,
wherein the light absorbing layer consists of Si, and
wherein a surface of the light absorbing layer forms a continuous interface with a surface of the light reflective layer,
wherein an upper surface of the light absorbing layer comprises:
a pattern having cone-shaped protrusions or grooves, wherein, optionally, an upper surface of the cone-shaped protrusions has a cut or a bottom surface of the grooves has a cut, and
wherein each of the cone-shaped protrusions and grooves of the pattern has an asymmetric cross-section.

2. The decoration element of claim 1, further comprising a color film provided:
on the light absorbing layer, such that the light absorbing layer is between the color film and the light reflective layer, or
on the light reflective layer, such that the light reflective layer is between the color film and the light absorbing layer.

3. The decoration element of claim 1, further comprising a substrate provided:
on the light absorbing layer, such that the light absorbing layer is between the substrate and the light reflective layer, or
on the light reflective layer, such that the light reflective layer is between the substrate and the light absorbing layer.

4. The decoration element of claim 1, wherein a surface of the light absorbing layer comprises at least two points at which corresponding thicknesses of the light absorbing layer are different.

5. The decoration element of claim 1, wherein the light absorbing layer comprises at least one region in which an upper surface is an inclined surface, which is inclined at an angle greater than 0 degrees and less than or equal to 90 degrees, and wherein the light absorbing layer comprises one or more regions having a thickness different from a thickness in any one region having the inclined surface.

6. The decoration element of claim 1, wherein the light absorbing layer has dichroism of $\Delta E^*ab > 1$.

7. The decoration element of claim 1, wherein, in the pattern having cone-shaped protrusions or grooves, two or less of the cone-shaped protrusions have the same shape when the upper surface of the pattern is observed while rotating the pattern 360 degrees around a vertex of the cone-shaped protrusions.

8. The decoration element of claim 1, wherein the light absorbing layer has a refractive index of 0 to 8 at 400 nm.

9. The decoration element of claim 1, wherein the light absorbing layer has an extinction coefficient of greater than 0 and less than or equal to 4 at 400 nm.

10. The decoration element of claim 1, which is a deco film or a case of a mobile device.

* * * * *